(12) United States Patent
Lyons

(10) Patent No.: US 9,358,696 B2
(45) Date of Patent: Jun. 7, 2016

(54) LOW AND HIGH PRESSURE PROXIMITY SENSORS

(75) Inventor: Joseph H. Lyons, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 714 days.

(21) Appl. No.: 13/378,395

(22) PCT Filed: Jun. 15, 2010

(86) PCT No.: PCT/EP2010/058335
§ 371 (c)(1),
(2), (4) Date: Dec. 15, 2011

(87) PCT Pub. No.: WO2011/012368
PCT Pub. Date: Feb. 3, 2011

(65) Prior Publication Data
US 2012/0120380 A1  May 17, 2012

Related U.S. Application Data

(60) Provisional application No. 61/230,189, filed on Jul. 31, 2009.

(51) Int. Cl.
*G03F 7/20* (2006.01)
*B26F 1/00* (2006.01)
(Continued)

(52) U.S. Cl.
CPC ............... *B26F 1/00* (2013.01); *C08F 220/14* (2013.01); *C08F 222/1006* (2013.01);
(Continued)

(58) Field of Classification Search
CPC ....... G01L 19/04; G01L 19/02; G01L 13/025; G01L 21/00; G01L 27/005; G01L 9/0041; G01L 9/0075; G01L 7/082; G01L 9/0044; G01L 19/0645; B26F 1/00; G02B 1/04; C08F 222/1006; C08F 220/14; C08L 33/00; G03F 7/707; G03F 7/7085; G03F 7/2041; G03F 7/70733; G03F 7/70925; G03F 7/7095; G03F 7/70808; G03F 7/70858; G03F 7/708
USPC .................................. 355/30, 53, 63, 72, 77
See application file for complete search history.

(56) References Cited

U.S. PATENT DOCUMENTS 2,779,188 A  1/1957 Meyer, Jr.
3,754,433 A  8/1973 Hyer
(Continued)

FOREIGN PATENT DOCUMENTS

CN  1510394 A  7/2004
DE  1 160 652 B  1/1964
(Continued)

OTHER PUBLICATIONS

English-Language DWPI Abstract for S.U. Patent Publication No. 1225634 A, published Apr. 23, 1986; 2 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

A fluid proximity sensor for surface measurements having a measurement chamber (210) with a measurement nozzle (205), a reference chamber (220) with a reference nozzle (225), and a diaphragm (215) forming an interface between the reference chamber and the measurement chamber. A shroud (280) that encloses the measurement nozzle and reference nozzle provides a peripheral gap (295) between the shroud and a work surface (290) being measured. By connecting either a partial vacuum supply or a partial fluid supply to the shroud, the internal shroud pressure can be raised or lowered and thus the gain-frequency operating regime of the proximity sensor optimized. Movement of the diaphragm in response to differential pressure changes can be sensed by optical, capacitive or inductive means (275).

20 Claims, 6 Drawing Sheets

(51) Int. Cl.
*G01B 13/12* (2006.01)
*G03F 9/00* (2006.01)
*C08F 220/14* (2006.01)
*C08F 222/10* (2006.01)
*G02B 1/04* (2006.01)
*B26F 1/44* (2006.01)

(52) U.S. Cl.
CPC ............... *G01B 13/12* (2013.01); *G02B 1/04* (2013.01); *G03F 9/7057* (2013.01); *B26F 2001/4418* (2013.01); *B26F 2001/4427* (2013.01); *Y10T 428/24843* (2015.01); *Y10T 428/26* (2015.01); *Y10T 428/31855* (2015.04)

(56) References Cited

U.S. PATENT DOCUMENTS

| | | | |
|---|---|---|---|
| 4,391,127 | A | 7/1983 | Hawkins |
| 4,550,592 | A | 11/1985 | Dechape |
| 4,953,388 | A | 9/1990 | Barada |
| 5,171,584 | A | 12/1992 | Ramsey et al. |
| 7,010,958 | B2 | 3/2006 | Gajdeczko et al. |
| 7,017,390 | B1 * | 3/2006 | Vogel ........................ 73/37.5 |
| 7,021,119 | B2 | 4/2006 | Violette |
| 7,021,120 | B2 | 4/2006 | Carter et al. |
| 7,549,321 | B2 | 6/2009 | Kochersperger et al. |
| 2005/0217384 | A1 * | 10/2005 | Gajdeczko et al. ............ 73/716 |
| 2005/0241371 | A1 | 11/2005 | Carter et al. |
| 2006/0123889 | A1 | 6/2006 | Vogel |
| 2006/0137430 | A1 * | 6/2006 | Violette ........................ 73/37.5 |
| 2006/0272394 | A1 | 12/2006 | Carter et al. |

FOREIGN PATENT DOCUMENTS

| | | |
|---|---|---|
| JP | 49-011356 A | 1/1974 |
| JP | 53-110162 A | 9/1978 |
| JP | 57-163844 A | 10/1982 |
| JP | 2007-218901 A | 8/2007 |
| SU | 1225634 A | 4/1986 |
| WO | WO 2006/111795 A1 | 10/2006 |

OTHER PUBLICATIONS

Zhang, B.-N., et al., "Non-Contact Proximity Sensor Based on Displacement Current," Chinese Journal of Sensors and Actuators, vol. 19, No. 6, Dec. 2006; 6 pages (with English-Language Abstract).

English-Language Translation of Notice of Reasons for Rejection directed to related Japanese Patent Application No. 2012-522056, mailed Apr. 14, 2014; 4 pages.

International Search Report directed to related International Patent Application No. PCT/EP2010/058335, mailed Sep. 1, 2010, from the European Patent Office; 5 pages.

International Preliminary Report on Patentability and the Written Opinion of the International Searching Authority directed to related International Patent Application No. PCT/EP2010/058335, mailed Jan. 31, 2012, from the International Bureau of WIPO; 7 pages.

* cited by examiner

LOW AND HIGH PRESSURE PROXIMITY SENSORS

CROSS-REFERENCE TO RELATED APPLICATIONS

This application claims the benefit of U.S. provisional application 61/230,189 which was filed on 31 Jul. 2009, and which is incorporated herein in its entirety by reference.

BACKGROUND OF THE INVENTION

1. Field of the Invention

The present invention relates to a proximity sensor, and in particular to a proximity sensor for use in semiconductor lithographic applications.

2. Background Art

Many automated manufacturing processes require the sensing of the distance between a manufacturing tool and the product or material surface being worked upon. In some situations, such as semiconductor lithography, that distance must be measured with an accuracy approaching a nanometer.

The challenges associated with creating a proximity sensor of such accuracy are significant, particularly in the context of photolithography systems. In the photolithography context, in addition to the need to be non-intrusive as well as to precisely detect very small distances, the proximity sensor cannot introduce contaminants or come in contact with the work surface, typically a semiconductor wafer. Occurrence of either situation may significantly degrade or ruin the quality of the material surface or product being worked upon.

Different types of proximity sensors are available to measure very small distances. Examples of proximity sensors include capacitance gauges and optical gauges. These proximity sensors have serious shortcomings when used in lithographic projection systems because the physical properties of materials deposited on wafers may impact the precision of these sensors. For example, capacitance gauges, being dependent on the concentration of electric charges, can yield spurious proximity readings in locations where one type of material (e.g., metal) is concentrated. More generally, optical and capacitive methods are prone to errors due to significant interactions with layers beneath photoresist coatings. Another class of problems occurs when exotic wafers made of non-conductive and/or photosensitive materials, such as Gallium Arsenide (GaAs) and Indium Phosphide (InP), are used. In these cases, capacitance gauges and optical gauges may provide spurious results, and are therefore not optimal.

U.S. application Ser. Nos. 11/646,612 and 10/322,768, and U.S. Pat. Nos. 4,953,388 and 4,550,592, all of which are incorporated herein by reference in their entireties, disclose an alternative approach to proximity sensing through the use of a fluid sensor. In this application, the use of the word "fluid" includes the use of either liquid or gas forms of a substance. A typical fluid sensor contains a reference nozzle and one or more measurement nozzles to emit a fluid flow onto reference and measurement surfaces. Measurements are made of the back pressure differences within the sensors to determine the distance between the measurement nozzle and the measurement surface. A fluid sensor is not vulnerable to concentrations of electric charges or to the electrical, optical or other physical properties of a wafer surface. A fluid sensor detects only the top physical layer, and thereby yields a superior result. Accordingly, these types of sensors are ideal for topographic measurement of a material surface, such as that used to establish focus prior to lithographic exposure.

In order for proximity sensors (often called air gauges) to be utilized in EUV lithographic applications, such proximity sensors need to operate in a hard vacuum environment. Such vacuum conditions require the proximity sensor to use limited fluid mass flow rates in order not to overload the pumping systems used to maintain vacuum. The fluid dynamics in a conventional operating region yields proximity sensors with excess pressure gain, but a slower response time due to the lower fluid mass flow rates.

In other applications, proximity sensors function in atmospheric conditions. In such environments, proximity sensors are limited by how much flow can be pushed through a nozzle without incurring a noise penalty. In such environments, a shroud is often employed in an attempt to isolate the nozzle from environmental pressure changes. Typically, such atmospheric-based proximity sensors suffer from low gain and high noise compared to their vacuum-based counterparts described above.

BRIEF SUMMARY OF THE INVENTION

What is needed is an apparatus and method to provide an accurate proximity sensor with suitable response times and gains for the flow rates appropriate for either a vacuum environment or an atmospheric environment when used in lithographic applications.

In one embodiment of the present invention, a proximity sensor is provided that includes a measurement chamber separated from a reference chamber by a diaphragm. The measurement chamber and the reference chamber receive fluid from a fluid supply, which each chamber vents through its own dedicated nozzle. In the case of the reference chamber, a reference surface is located proximate to the reference nozzle. The proximity of the measurement nozzle to a work surface affects the pressure in the measurement chamber, such that a pressure differential exists across the diaphragm. That pressure differential (and in turn the associated proximity of the work surface) results in movement of the diaphragm. A shroud substantially encloses the measurement nozzle, reference nozzle and work surface, leaving a peripheral gap between the shroud and the work surface for fluid to vent to the environment.

In a further embodiment of the present invention, a partial fluid supply is coupled to the shroud in situations where the external environment of the proximity sensor is a vacuum. By providing an adjustable supply of fluid into the interior of the shroud, additional flexibility is provided in terms of steering the proximity sensor to a particular operating regime.

In a still further embodiment of the present invention, a partial vacuum supply is coupled to the shroud in situations when the external environment is atmospheric pressure. By withdrawing an adjustable amount of fluid from the interior of the shroud, again additional flexibility is provided in terms of steering the proximity sensor to a particular operating regime.

In a still further embodiment of the present invention, sensing of the diaphragm movement is provided. An external sensor can measure the movement of the diaphragm in response to the pressure differential. Different means of sensing are within the scope of the current invention, including optical, inductive and capacitive sensing.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings. In the drawings, like reference numbers indicate identical or functionally similar elements.

FIGS. 1A and 1B respectively depict reflective and transmissive lithographic apparatuses.

Figure 5:
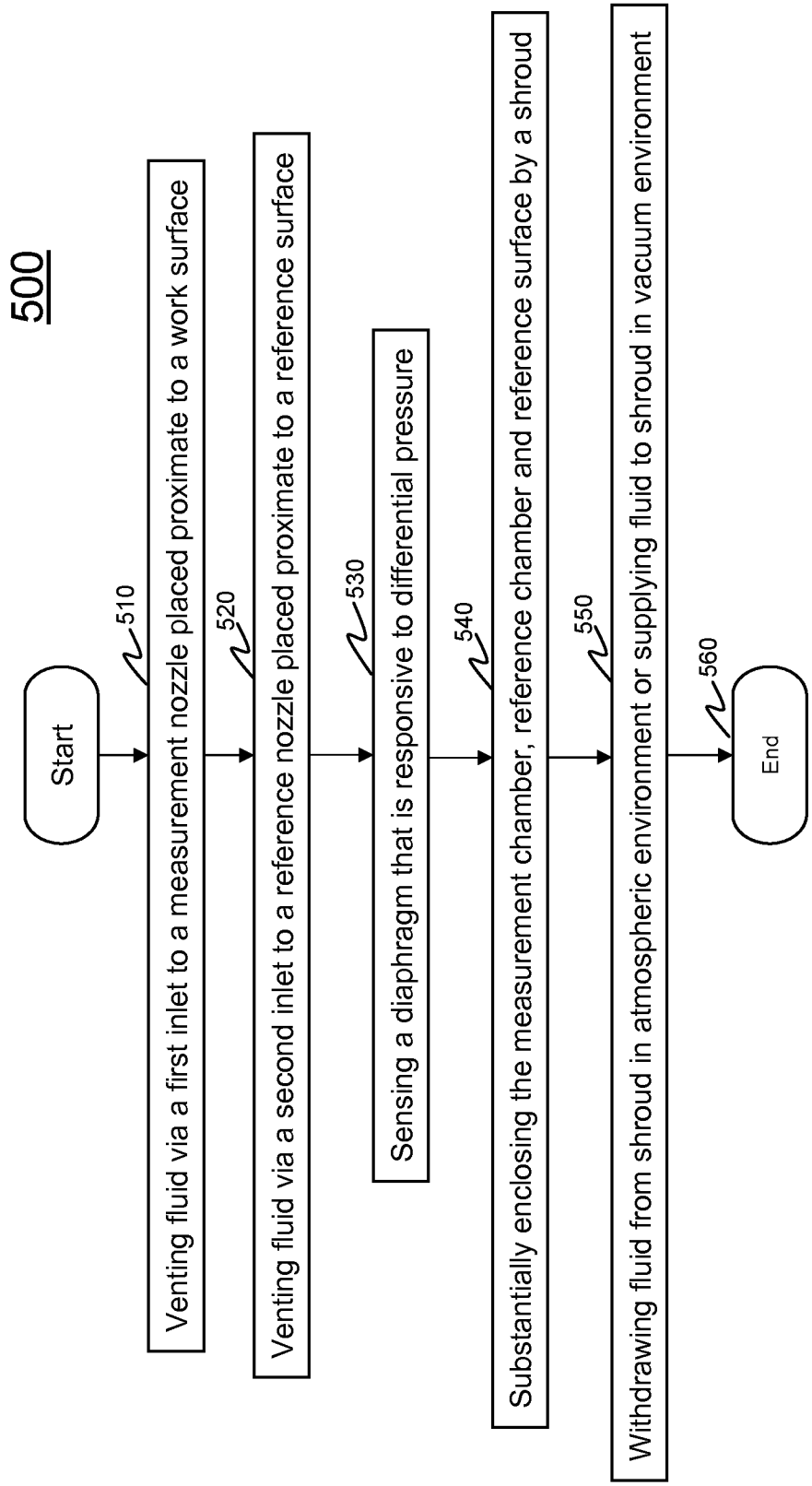

FIG. 5 provides a flowchart of a method that uses a shroud to improve the gain and operating bandwidth of a proximity sensor, according to an embodiment of the current invention.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1A:
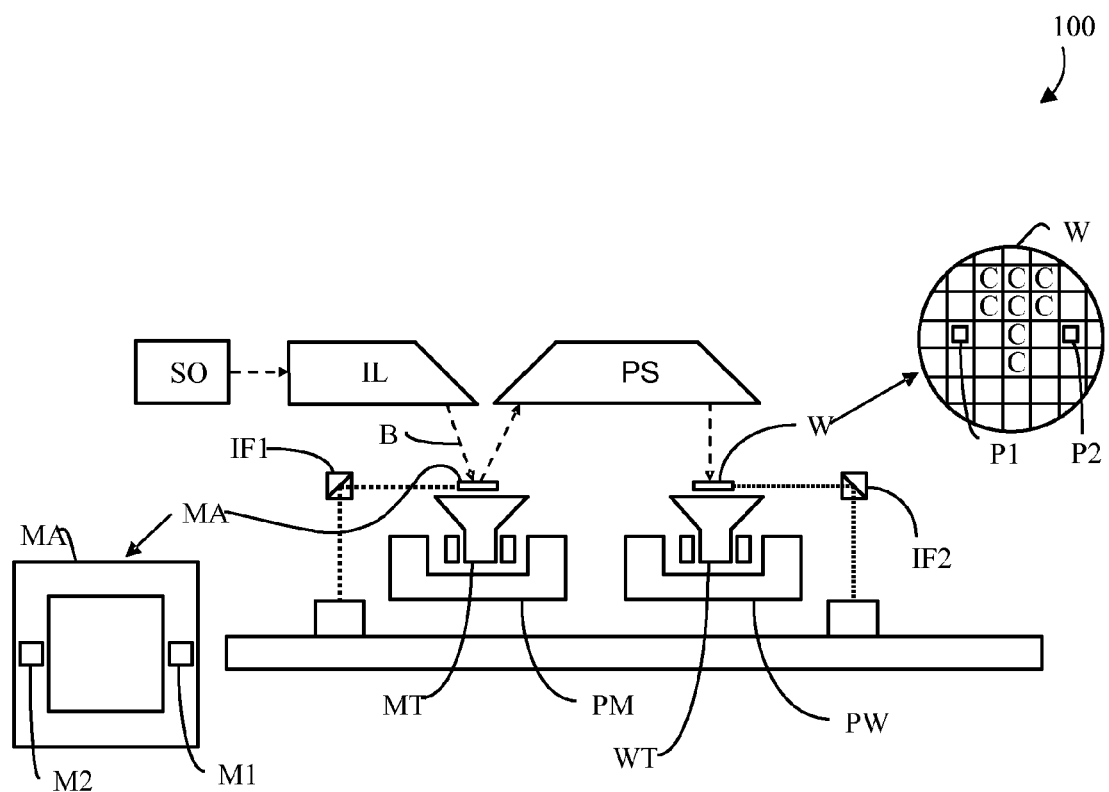
Figure 1B:
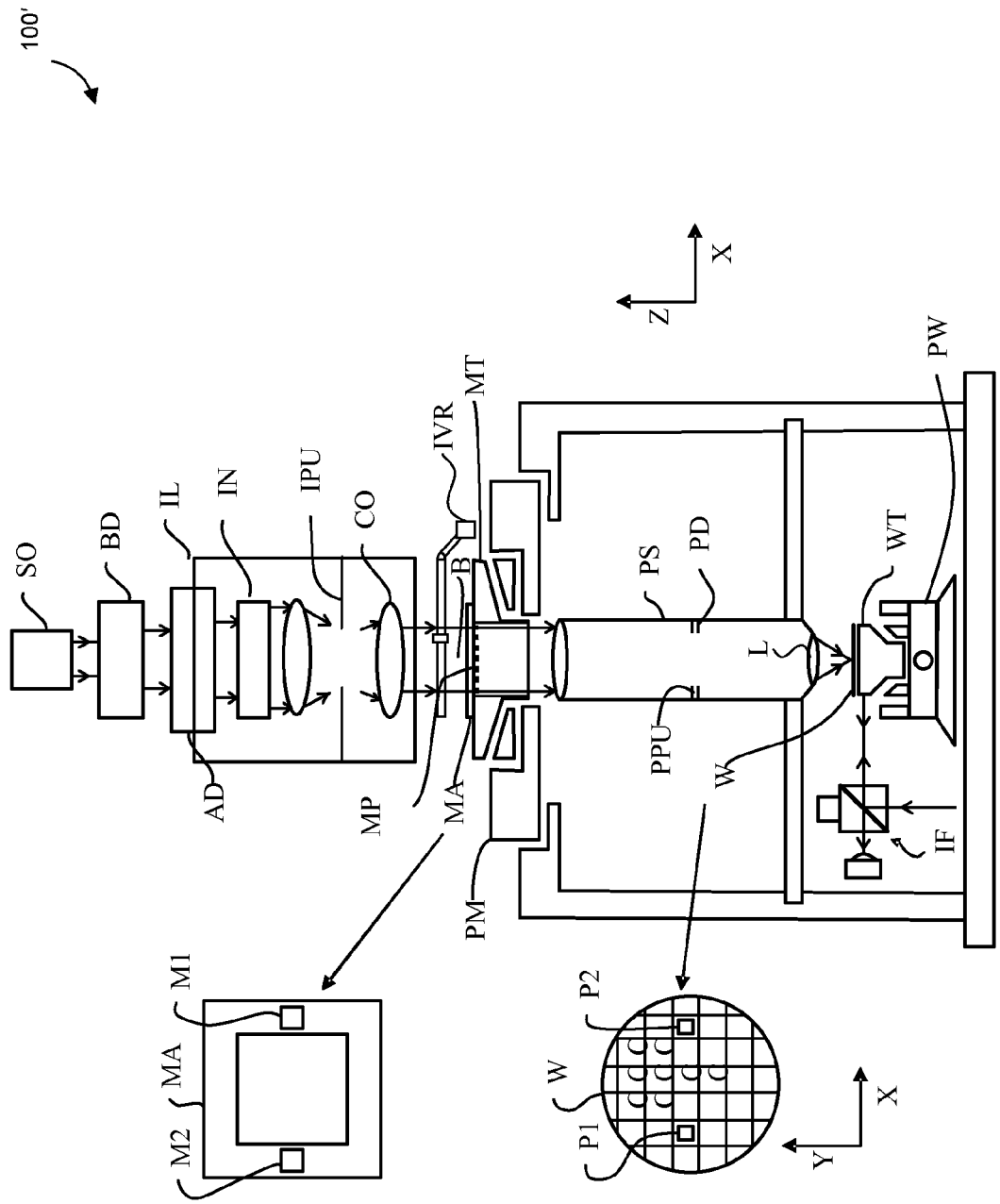

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure. When the preparatory steps can be performed while one or more other substrate tables WT are being used for exposure, the preparatory steps are said to occur during an "in-line phase" because the preparatory steps are performed within the desired throughput of the lithographic apparatus 100 and/or lithographic apparatus 100'. In contrast, when the preparatory steps cannot be performed while one or more other substrate tables WT are being used for exposure, the preparatory steps are said to occur during an "off-line phase" because the preparatory steps cannot be performed within a desired throughput of lithographic apparatus 100 and/or lithographic apparatus 100'. As described in more detail herein, focus-positioning parameters of an exposure system (such as, for example projection system PS of lithographic apparatuses 100, 100') may be determined in an off-line phase, an in-line phase, or a combination thereof.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes.

In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

Figure 2:
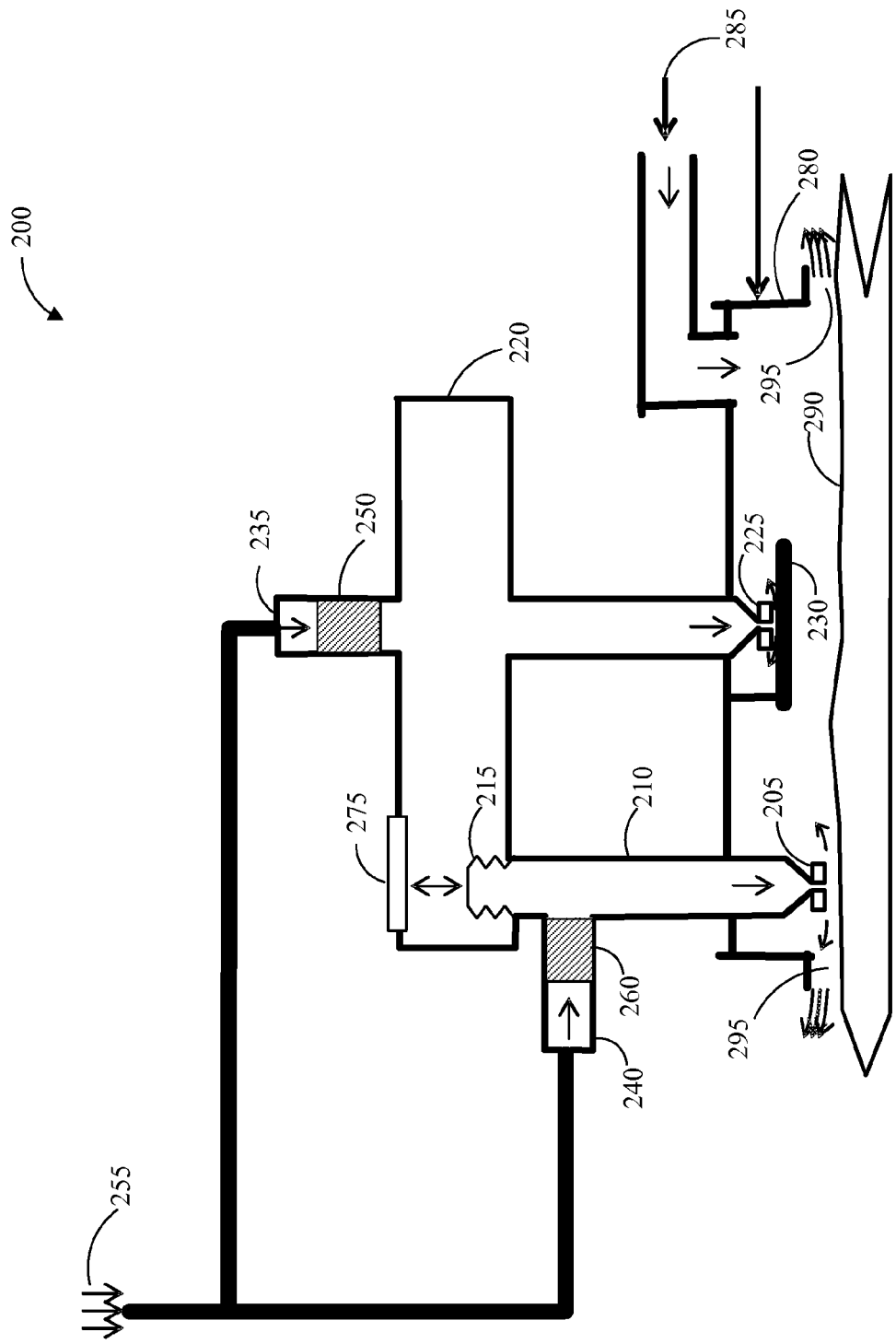
FIG. 2 is a diagram of a high pressure proximity sensor, according to an embodiment of the current invention.

FIG. 2 provides a diagram of a high pressure proximity sensor 200, in accordance with an embodiment of the current invention. High pressure proximity sensor 200 operates in a low pressure environment, typically a vacuum. Proximity sensor 200 includes a measurement nozzle 205, a measurement chamber 210, a diaphragm 215, a reference chamber 220, a reference nozzle 225, a reference surface 230, a reference inlet 235, and a measurement inlet 240. Fluid supply 255 supplies fluid to proximity sensor 200 via measurement inlet 240 and reference inlet 235. Control over the supply of fluid from fluid supply 255 can be exercised by an optional reference restrictor 250 and an optional measurement restrictor 260, where the restrictors form a part of the respective inlets 235 and 240, respectively.

Diaphragm 215 forms part of a common wall between (i.e., is common to or forms an interface between) reference chamber 220 and measurement chamber 210, and therefore separates reference chamber 220 from measurement chamber 210. Venting of fluid is achieved via the nozzles associated with each chamber. The ease with which fluid vents depends upon the proximity of the particular nozzle to a nearby exterior surface. For example, the ease with which fluid vents from measurement nozzle 205 depends upon its proximity to a nearby work surface 290, e.g., a semiconductor wafer surface. In the case of reference nozzle 225, a reference surface 230 is placed adjacent and proximate to reference nozzle 225. By adopting such a placement of reference surface 230, a reference pressure is established in reference chamber 220. The pressure in measurement chamber 210 is established by the proximity of measurement nozzle 225 to nearby work surface 290. Diaphragm 215 moves in response to the pressure difference variations between reference chamber 220 and measurement chamber 210. Such variations in pressure are in turn responsive to the topographic changes in work surface 290 under scrutiny by proximity sensor 200.

Surrounding measurement nozzle 205, reference nozzle 225 and work surface 290 is a shroud 280 that comes close to, but does not fully contact, work surface 290. Instead, shroud 280 leaves a peripheral gap 295 between shroud 280 and work surface 290 through which fluid can escape to the low pressure environment, where the pressure is typically a vacuum. Both measurement nozzle 205 and reference nozzle 225 vent fluid into the interior of shroud 280, which in turn vents fluid to the environment via peripheral gap 295 between shroud 280 and work surface 290. Peripheral gap 295 changes affect the fluid dynamics and hence the venting of fluid from measurement nozzle 205 and reference nozzle 225 to the environment. Importantly, the accuracy of proximity sensor 200 is somewhat insensitive to peripheral gap 295 changes since the differential bridge architecture of proximity sensor 200 provides common mode rejection of such variations that are common to both the reference and measurement branches of the bridge architecture. Other sources of common mode error that are rejected include variations in fluid supply pressure, variations in ambient room pressures, effects due to wind currents, and the like as would be known to a person having ordinary skill in the art.

Shroud 280 provides the following advantages to the capabilities of proximity sensor 200. As noted above, fluid vents from measurement chamber 210 and reference chamber 220 to the external environment via shroud 280. From the perspective of measurement nozzle 205, it vents into a higher pressure environment than otherwise present were measurement nozzle 205 to vent into the lower pressure environment, typically a vacuum. The actual pressure drop from the inside of shroud 280 to the external environment is the result of a number of factors, including the net fluid mass flow, the cross sectional area of peripheral gap 295, and the perimeter of shroud 280. These parameters allow a tradeoff between excess pneumatic gain (i.e., ratio of differential pressure to proximity distance) and a desired decrease in response time, i.e., increase in response bandwidth of proximity sensor 200.

By way of example, proximity sensor 200 provides the following operational advantage. A conventional high pressure proximity sensor (i.e., without the benefit of shroud 280) venting into a 100 Pa external environment, yields a 40 Hz operational bandwidth. However, in accordance with an embodiment of the present invention, when shroud 280 is added in the manner described above, the operational bandwidth increases to 150 Hz through boosting the apparent external pressure of measurement nozzle 205 to 4 kPa.

Should design limitations constrain the size of shroud 280 and peripheral gap 295 dimensions, an extended operating range of proximity sensor 200 can be obtained by adding an optional fluid supply. In this alternative embodiment, shroud 280 contains a shroud coupling 285 through which additional fluid can be supplied from the optional fluid supply and directed into the interior of shroud 280. By adjusting the supplemental supply of fluid from the optional fluid supply, the fluid flow can be adjusted with a resulting change in the operating regime of proximity sensor 200. Further details are provided below in the discussion of FIG. 4.

Figure 3:
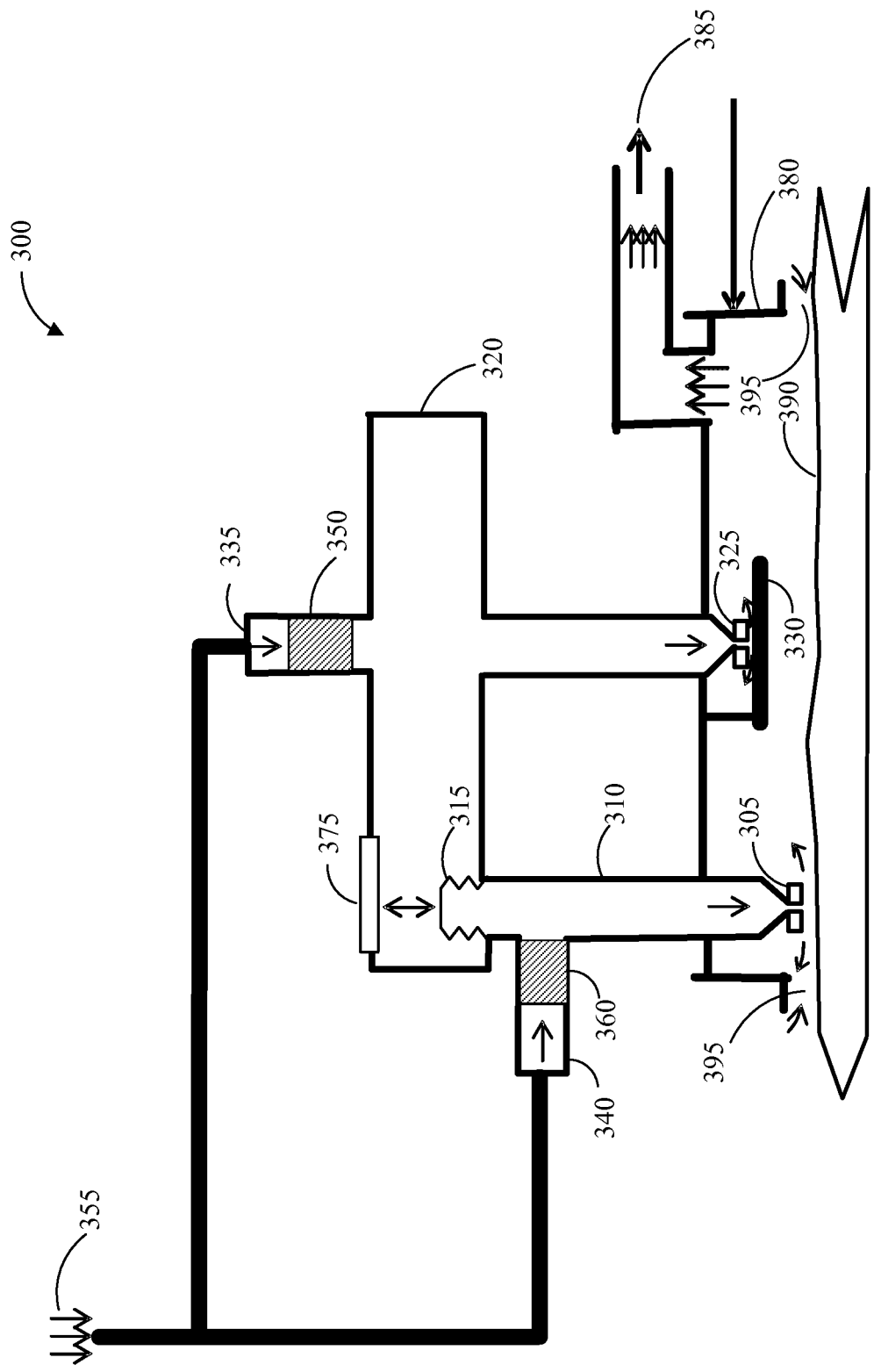
FIG. 3 is a diagram of a low pressure proximity sensor, according to an embodiment of the current invention.

A low pressure proximity sensor 300 can also be developed using similar principles to that used for proximity sensor 200. Low pressure proximity sensor 300 operates in a high pressure environment, typically at atmospheric pressure. FIG. 3 provides a diagram of a low pressure proximity sensor 300, in accordance with an embodiment of the current invention. Proximity sensor 300 includes a measurement nozzle 305, a measurement chamber 310, a diaphragm 315, a reference chamber 320, a reference nozzle 325, a reference surface 330, a reference inlet 335, and a measurement inlet 340. Fluid supply 355 supplies fluid to pressure proximity sensor 300 via measurement inlet 340 and reference inlet 335. Control over the supply of fluid from fluid supply 355 can be exercised by an optional reference restrictor 350 and an optional measurement restrictor 360, where the restrictors form a part of the respective inlets 335 and 340, respectively.

Similar to FIG. 2, diaphragm 315 forms an interface between reference chamber 320 and measurement chamber 310, and as such separates reference chamber 320 from measurement chamber 310. Venting of fluid is achieved via the nozzles associated with each chamber. The ease with which fluid vents depends upon the proximity of the particular nozzle to a nearby exterior surface. For example, the ease with which fluid vents from measurement nozzle 305 depends upon its proximity to a nearby work surface 390, e.g., a semiconductor wafer surface. In the case of reference nozzle 325, a reference standoff 330 is placed adjacent and proximate to reference nozzle 325. By adopting such a placement of reference standoff 330, a reference pressure is established in reference chamber 320. The pressure in measurement chamber 310 is established by the proximity of measurement nozzle 325 to nearby work surface 390. Diaphragm 315 moves in response to the pressure difference variations between reference chamber 320 and measurement chamber 310. Such variations in pressure are in turn responsive to the topographic changes in work surface 390 under scrutiny by proximity sensor 300.

Surrounding measurement nozzle 305, reference nozzle 325 and work surface 390 is a shroud 380 that comes close to, but does not fully contact, work surface 390. Instead, shroud 380 leaves a peripheral gap 395 between shroud 380 and work surface 390 through which fluid can be withdrawn from the environment, where the pressure is typically atmospheric pressure. Both measurement nozzle 305 and reference nozzle 325 vent fluid into the interior of shroud 380. Shroud 380 contains a shroud coupling 385 through which a fluid can be withdrawn from the interior of shroud 380 by a vacuum supply. Thus, measurement nozzle 305 and reference nozzle 325 vent into a partial pressure, instead of an atmospheric pressure. In a particular embodiment, the outside to inside pressure drop of shroud 380 can be about 50 kPa.

Proximity sensor 300 offers the following advantages. First, the gain (i.e., pressure change as a function of peripheral gap 395) of proximity sensor 300 increases without an associated increase in fluid mass flow. This is due to the increased velocity under peripheral gap 395. While increasing fluid mass flow can also increase velocity (and thereby increase the gain), such an approach incurs the risk of increased noise since the density of the fluid flow also increases.

Second, the architecture of proximity sensor 300 provides better isolation to atmospheric pressure fluctuations. Sources of atmospheric pressure fluctuations include, for example, variations due to personnel entry into a clean room, and wind currents resulting from the movement of wafer tables at high speed. The pressure drop provided at the interface of shroud 380 is much greater in this inward-flow architecture than the pressure drop provided by the conventional outward-flow architecture. For example, the conventional outward-flow architecture realizes a shroud pressure drop of approximately 100 Pa. By contrast, the outside-to-inside pressure drop in proximity sensor 300 can be approximately 50 kPa in a particular embodiment of proximity sensor 300. Thus, the ability of exterior environmental pressure fluctuations to affect interior shroud fluctuations is much reduced.

Figure 4:
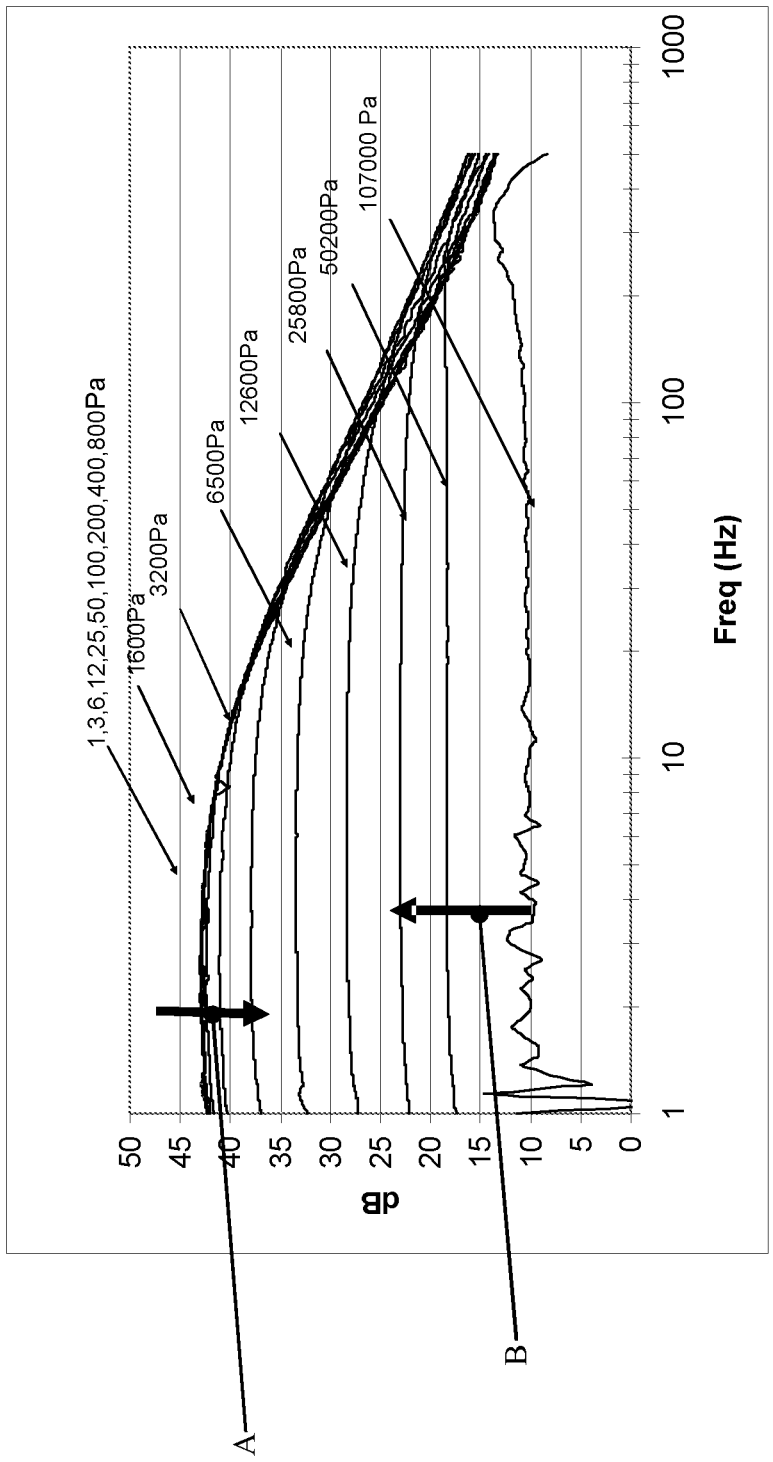
FIG. 4 illustrates the gain and response bandwidth of a proximity sensor as a function of the chamber pressure, according to an embodiment of the current invention.

FIG. 4 illustrates the ability of proximity sensors 200 and 300 to adjust proximity sensor performance in terms of operating bandwidth and gain. FIG. 4 illustrates sensor gain versus frequency for a variety of chamber pressures. Here, gain is the ratio of pressure change to change in measurement nozzle proximity to a work surface and thus is a measure of the sensitivity of the sensor to convert small changes of proximity into significant changes in measured pressure variations. Typically, the gain of a proximity sensor is measured in dB. As FIG. 4 shows, with low chamber pressures (i.e., less than 1 kPa), the proximity sensor has a large gain but a low bandwidth. Conversely, with chamber pressures approaching atmospheric pressure (i.e., approximately 100 kPa), the proximity sensor has a large bandwidth, but a low gain. Clearly, an optimal operating regime exists in between these two extremes. Thus, by moving the operating regime away from these two extremes into the middle (as shown by the arrows A and B), a better performance from the proximity sensor can be achieved. For example, in a low pressure environment (e.g., a vacuum), the use of shroud 280 in proximity sensor 200 moves the operating regime in the direction of arrow A in FIG. 4. Similarly, in a high pressure environment (e.g., atmospheric pressure), the use of shroud 380 in proximity sensor 300 moves the operating regime in the direction of arrow B in FIG. 4.

In further embodiments of the present invention, movement of diaphragms 215, 315 in response to the pressure differential can be measured by position sensors 275, 375. Position sensors 275 and 375 output a signal that is responsive to the movement of its respective diaphragm 215 and 315. These position sensors 275 and 375 can use a number of different means of diaphragm movement detection, including capacitive, inductive, or optical means. In still further embodiments of the present invention, the position sensors 275 and 375 can be isolated from diaphragms 215 and 315 within the measurement chambers 210 and 310 through the use of transparent materials, i.e. window-like in that they do not interfere with the diaphragm sensing mechanism. For example, the use of an optically transparent material would be suitable for isolation when the sensing mechanism is an optical mechanism. Similarly, a non-conductive material is suitable for isolation when the sensing mechanism is a capacitive mechanism. Finally, a low-permeability material is suitable for the "transparent material" when the sensing mechanism is an inductive mechanism.

A wide set of gases can be used as the fluid in the present invention, subject to the requirement to be inert (and thereby not interact with the work surfaces 290, 390 whose topology is undergoing scrutiny). Examples of a gas suitable for use with the present invention include but are not limited to air, nitrogen, hydrogen or any non-reactive compressible gas.

FIG. 5 provides a flowchart of an exemplary method 500 that uses fluid flow through a measurement nozzle to perform proximity measurements on a work surface, according to an embodiment of the present invention.

The process begins at step 510. In step 510, fluid is vented via a first inlet to a measurement nozzle placed proximate to a work surface. The work surface can be provided, for example, by substrate WT, as illustrated in FIGS. 1A and 1B. The measurement nozzle can be provided, for example, by measurement nozzles 205 and 305, as illustrated in FIGS. 2 and 3. The first inlet can be provided, for example, by inlets 240 and 340, as illustrated in FIGS. 2 and 3.

In step 520, fluid is vented via a second inlet to a reference nozzle placed proximate to a reference surface. The reference nozzle can be provided, for example, by reference nozzles 225 and 325, as illustrated in FIGS. 2 and 3. The second inlet can be provided, for example, by inlets 235 and 335, as illustrated in FIGS. 2 and 3.

In step 530, movement is sensed of a diaphragm that is responsive to the application of differential pressure. The diaphragm can be provided, for example, by diaphragms 215 and 315, as illustrated in FIGS. 2 and 3. Sensing can be performed, for example, by position sensors 275 and 375.

In step 540, the measurement chamber, the reference chamber and the reference surface are substantially enclosed by a shroud. The shroud can be provided, for example, by shrouds 280 and 380, as illustrated in FIGS. 2 and 3.

In step 550, when the environment is at atmospheric pressure, fluid is withdrawn by coupling the shroud to a partial vacuum supply. Alternatively, in step 550, when the environment is a vacuum, fluid is supplied by coupling the shroud to a partial fluid supply. In the case of a vacuum environment, step 550 is an optional step.

At step 560, method 500 ends.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus comprising:
   a measurement chamber comprising a first inlet and a measurement nozzle, the measurement nozzle being proximate to a work surface;
   a reference chamber comprising a second inlet and a reference nozzle, the reference nozzle being proximate to a reference surface;
   a diaphragm configured to be responsive to a differential pressure between the measurement chamber and the reference chamber, wherein the diaphragm is configured to form an interface between the measurement chamber and the reference chamber; and
   a shroud, substantially surrounding both the measurement nozzle and the reference nozzle, configured to provide a common mode rejection of variations in factors that affect both the measurement nozzle and the reference nozzle, wherein:
   the shroud is positioned above the work surface such that a gap is present between the shroud and the work surface; and
   the shroud comprises a shroud coupling configured to control a fluid flow to a volume located between the shroud and the work surface to control operating parameters of the apparatus.

2. The apparatus of claim 1, further comprising:
   a partial vacuum supply coupled to the shroud.

3. The apparatus of claim 1, further comprising:
   a partial fluid supply coupled to the shroud.

4. The apparatus of claim 3, wherein the fluid comprises one of air, nitrogen, and hydrogen.

5. The apparatus of claim 3, wherein the fluid comprises a non-reactive compressible gas.

6. The apparatus of claim 1, wherein the first inlet and the second inlet comprise a first restrictor and a second restrictor, respectively.

7. The apparatus of claim 1, further comprising:
   a position sensor configured to output a signal responsive to a movement of the diaphragm.

8. A method comprising:
   venting fluid via a first inlet to a measurement nozzle of a measurement chamber, the measurement nozzle being proximate to a work surface;
   venting fluid via a second inlet to a reference nozzle of a reference chamber, the reference nozzle being proximate to a reference surface;
   sensing a movement of a diaphragm that is responsive to a differential pressure between the measurement chamber and the reference chamber, wherein the diaphragm forms an interface between the measurement chamber and the reference chamber;
   substantially surrounding both the measurement chamber and the reference chamber using a shroud to provide a common mode rejection of variations in factors that affect both the measurement nozzle and the reference nozzle, wherein the shroud is positioned above the work surface such that a gap is present between the shroud and the work surface; and
   controlling a fluid flow to a volume located between the shroud and the work surface using a shroud coupling to control the sensing of the movement of the diaphragm.

9. The method of claim 8, further comprising:
   coupling the shroud to a partial vacuum supply.

10. The method of claim 8, further comprising:
    coupling the shroud to a partial fluid supply.

11. The method of claim 8, wherein the venting via a first inlet and the venting via a second inlet include venting one of air, nitrogen, and hydrogen via the first inlet and the second inlet.

12. The method of claim 8, wherein the venting via a first inlet and the venting via a second inlet include venting a non-reactive compressible gas via the first inlet and the second inlet.

13. The method of claim 8, wherein the venting via a first inlet and the venting via a second inlet include using a first restrictor and a second restrictor in the first inlet and the second inlet, respectively.

14. The method of claim 8, further comprising:
    outputting a signal based on a movement of the diaphragm.

15. The method of claim 14, further comprising measuring the movement of the diaphragm using an optical sensor, a capacitive sensor, or an inductive sensor.

16. A lithographic system comprising:
    a support device configured to support a patterning device that is capable of patterning a beam of radiation;
    a projection system configured to project the patterned beam of radiation onto a substrate; and
    a proximity sensor configured to measure proximity from the substrate comprising:
       a measurement chamber including a first supply inlet and a measurement nozzle, the measurement nozzle being proximate to a work surface;
       a reference chamber including a second supply inlet and a reference nozzle, the reference nozzle being proximate to a reference surface;
       a diaphragm configured to be responsive to a differential pressure between the measurement chamber and the reference chamber, wherein the diaphragm is configured to form an interface between the measurement chamber and the reference chamber; and
       a shroud, substantially surrounding both the measurement nozzle and the reference nozzle, configured to provide a common mode rejection of variations in factors that affect both the measurement nozzle and the reference nozzle, wherein:
       the shroud is positioned above the work surface such that a gap is present between the shroud and the work surface; and
       the shroud comprises a shroud coupling configured to control a fluid flow to a volume located between the shroud and the work surface to control operating parameters of the proximity sensor.

17. The lithographic system of claim 16, further comprising:
    a partial vacuum supply or a partial fluid supply coupled to the shroud.

18. The lithographic system of claim 17, wherein the fluid comprises one of air, nitrogen, a non-reactive compressible gas, and hydrogen.

19. The lithographic system of claim 16, wherein the first and second inlets include a first restrictor and a second restrictor, respectively.

20. The lithographic system of claim 16, further comprising:
    an optical, conductive, or inductive position sensor configured to output a signal responsive to a movement of the diaphragm.

* * * * *